United States Patent
Wikus et al.

(10) Patent No.: US 10,655,783 B2
(45) Date of Patent: May 19, 2020

(54) CRYOGEN-FREE MAGNET SYSTEM COMPRISING A HEAT SINK CONNECTED TO THE GAS CIRCUIT OF A CRYOCOOLER

(71) Applicant: Bruker BioSpin AG, Faellanden (CH)

(72) Inventors: Patrick Wikus, Nuerensdorf (CH); Joerg Hinderer, Waldshut-Tiengen (DE)

(73) Assignee: BRUKER SWITZERLAND AG, Faellanden (CH)

( * ) Notice: Subject to any disclaimer, the term of this patent is extended or adjusted under 35 U.S.C. 154(b) by 97 days.

(21) Appl. No.: 15/680,313

(22) Filed: Aug. 18, 2017

(65) Prior Publication Data

US 2018/0051852 A1 Feb. 22, 2018

(30) Foreign Application Priority Data

Aug. 18, 2016 (DE) .................. 10 2016 215 518

(51) Int. Cl.
| | | |
|---|---|---|
| *F17C 3/08* | (2006.01) | |
| *F25B 9/14* | (2006.01) | |
| *H01F 6/04* | (2006.01) | |
| *F25D 19/00* | (2006.01) | |

(Continued)

(52) U.S. Cl.
CPC .............. *F17C 3/085* (2013.01); *F25B 9/145* (2013.01); *F25D 19/006* (2013.01); *G01R 33/3804* (2013.01); *H01F 6/04* (2013.01); *F17C 2250/03* (2013.01); *F17C 2250/043* (2013.01); *F17C 2250/0439* (2013.01); *F17C 2270/02* (2013.01); *F25B 2309/1428* (2013.01); *G01R 33/3815* (2013.01)

(58) Field of Classification Search
CPC ........ F16C 3/085; F25B 9/145; F25D 19/006; G01R 33/3804; H01F 6/04; F17C 2270/02; F17C 2250/03; F17C 2250/043; F17C 2250/0439
USPC .......................................... 62/51.1
See application file for complete search history.

(56) References Cited

U.S. PATENT DOCUMENTS

| | | |
|---|---|---|
| 5,410,286 A | 4/1995 | Herd et al. |
| 5,889,456 A | 3/1999 | Triebe et al. |

(Continued)

FOREIGN PATENT DOCUMENTS

| | | |
|---|---|---|
| CN | 101937750 A | 1/2011 |
| CN | 102054554 A | 5/2011 |

(Continued)

*Primary Examiner* — Joel M Attey
(74) *Attorney, Agent, or Firm* — Edell, Shapiro & Finnan, LLC (57) ABSTRACT

A cryostat arrangement includes a superconducting magnet to be cooled by an active cryocooler. The cryocooler includes a coolant circuit with a compressor, a cold head, and a cold finger in thermal contact with the magnet. A volumetric vessel containing cryogenic fluid is thermally coupled to the magnet. The volumetric vessel is connected to the coolant circuit by a pressure-resistant line. A fluidic component influences the flow rate through the line in a defined manner such that the cryogenic fluid flows between the volumetric vessel and the coolant circuit with a time constant of at least 15 minutes. The cryostat can be operated in a "cryogen-free" manner and permits a sufficiently long time to quench in the event of operational malfunctions.

19 Claims, 5 Drawing Sheets

(51) Int. Cl.
  *G01R 33/38*   (2006.01)
  *G01R 33/3815*   (2006.01)

(56) References Cited

U.S. PATENT DOCUMENTS

| | | | |
|---|---|---|---|
| 6,016,659 A * | 1/2000 | Westhoven, Jr. | F25B 9/02 62/51.2 |
| 6,107,905 A | 8/2000 | Itoh et al. | |
| 7,263,839 B2 | 9/2007 | Overweg | |
| 7,476,020 B2 * | 1/2009 | Zufferey | G05B 17/02 374/134 |
| 8,602,049 B2 | 12/2013 | Lose et al. | |
| 9,234,691 B2 * | 1/2016 | Black | F17O 13/007 |
| 2005/0046423 A1 | 3/2005 | Marek | |
| 2005/0068034 A1 | 3/2005 | Morita et al. | |
| 2006/0097146 A1 * | 5/2006 | Strobel | F25B 9/02 250/286 |
| 2011/0056218 A1 | 3/2011 | Blakes | |
| 2011/0179809 A1 | 7/2011 | Zhang et al. | |
| 2013/0014517 A1 | 1/2013 | Diederichs et al. | |
| 2013/0186110 A1 * | 7/2013 | Pamidi | F25B 25/005 62/51.1 |
| 2015/0323619 A1 | 11/2015 | Bouleau et al. | |
| 2015/0332829 A1 * | 11/2015 | Stautner | H01F 6/04 505/162 |
| 2016/0084440 A1 | 3/2016 | Strobel | |
| 2017/0314739 A1 * | 11/2017 | Rieker | F17O 13/003 |

FOREIGN PATENT DOCUMENTS

| | | |
|---|---|---|
| CN | 102959423 A | 3/2013 |
| DE | 19914778 B4 | 10/1999 |
| DE | 10340352 A1 | 4/2005 |
| DE | 10340352 B4 | 4/2005 |
| DE | 102004053972 B3 | 7/2006 |
| DE | 102014218773 A1 | 3/2016 |
| EP | 0937953 A1 | 8/1999 |
| WO | 2016038093 A1 | 3/2016 |

* cited by examiner

CRYOGEN-FREE MAGNET SYSTEM COMPRISING A HEAT SINK CONNECTED TO THE GAS CIRCUIT OF A CRYOCOOLER

CROSS REFERENCE TO RELATED APPLICATIONS

This application claims foreign priority under 35 U.S.C. § 119(a)-(d) to German Application No. 10 2016 215 518.0 filed on Aug. 18, 2016, the entire contents of which are hereby incorporated into the present application by reference.

FIELD OF THE INVENTION

The present invention relates to a cryogenic system for cooling a superconducting magnet coil system as used, for example, in magnetic resonance processes, such as nuclear magnetic resonance (NMR) spectroscopy or magnetic resonance imaging (MRI). The applicability of the invention is not restricted to this field.

BACKGROUND

The invention relates to a cryostat arrangement comprising a vacuum vessel in which a superconducting magnet coil system to be cooled is arranged, a cryocooler that actively cools the cryostat arrangement. The cryocooler comprises a coolant circuit with a compressor and a cold head, which may have a single-stage or dual-stage cooling arm that is in thermal contact with the superconducting magnet coil system. The cryostat further comprises a volumetric vessel containing a cryogenic fluid, such as helium. The volumetric vessel is arranged such that it is thermally conductively connected to the superconducting magnet coil system and/or to parts of the cryostat arrangement enabling ambient heat to flow to the superconducting magnet coil system.

Nuclear magnetic resonance apparatuses, in particular for NMR spectrometry or NMR tomography, require strong magnetic fields, which are often generated by superconducting magnet coils. The superconducting magnet coils are operated at a cryogenic temperature. The magnet coils are typically arranged in a "non-dry" cryogenic vessel of a cryostat, which is filled with a cryogenic liquid such as liquid helium. In order to maintain the operating temperature on a long-term basis and at the same time minimize the consumption of cryogenic liquids, the cold finger of a cold head projects into the cryogenic vessel to absorb heat. The cryogenic vessel is surrounded by a vacuum vessel for thermal insulation. However, many users prefer "cryogen-free" magnets, which largely forgo the use of cryogenic liquids (e.g. liquid helium and/or liquid nitrogen) and maintain the operating temperature exclusively by means of "cryocoolers", i.e. in a "dry" manner. Pulse tube, Stirling or Gifford-McMahon coolers are typically used in this case.

A cryogen-free magnet system of this kind typically have a very short time to quench (TTQ). If the cryocooler malfunctions (e.g., as a result of a power outage, an interruption to the cooling water supply, or a mechanical defect in the compressor or cold head), the magnet system very quickly heats up beyond the allowable operating temperature, the superconductivity breaks down, and the magnet system quenches. The magnet system then cannot be used for a long time, since it must be cooled back down and recharged.

For this purpose, separate systems may be provided for automatically filling the reservoir after a malfunction of the active cryocooler. Currently, a gas cylinder, normally filled with helium, may be used. However, repeated cryocooler malfunctions may leave the gas cylinder empty, requiring the gas cylinder to be replaced.

Another option is to connect the reservoir to a storage volume, typically at room temperature, into which the cryogen can flow out. The storage volume typically has to be very large in order to prevent an impermissibly sharp increase in pressure.

Another option is to design the helium reservoir and the storage volume (if provided) to be hermetically sealed and mechanically very stable, such that they withstand the extremely high pressures that build up when helium is vaporized and heated in a small, closed space. A reservoir of this kind is compact, but is very heavy and is also relatively expensive. It is particularly disadvantageous that the pressure is at its highest in warm conditions and drops during operation, i.e. the reservoir is oversized for the pressures prevailing in normal operation.

According to the European patent document EP 0 937 953 A1, the TTQ can be prolonged by storing small amounts of a cryogen in a reservoir provided for this purpose. The device described is disadvantageous, however, in that the storage volume has to be very large (e.g., 1200 liters in the practical example of the patent document).

In the cryostat arrangement according to document German patent reference DE 199 14 778 B4, the TTQ is prolonged by storing small amounts of a cryogen in a reservoir provided for this purpose. Here too, the reservoir is connected to a separate storage volume that has to be very large.

In the German patent reference DE 10 2014 218 773 A1, a completely different approach is taken to prolong the TTQ. Instead of increasing the thermal capacity and the available thermal capacity, the thermal coupling between the coil and the cryocooler is reduced if the active cryocooler malfunctions.

The U.S. patent reference U.S. Pat. No. 7,263,839 B2 describes providing some liquid helium in a cryogen-free system in order to prolong the TTQ. However, the gas circuit of the active cooler is not used to prolong the TTQ here and, in one of the embodiments described, this requires a separate compressor and therefore increases the complexity of the system.

In the U.S. patent reference U.S. Pat. No. 5,410,286, a small amount of liquid helium is used in an otherwise "dry" system. However, the gas circuit of the active cryocooler is not used to prolong the TTQ. In the embodiments described, the cryogen escapes into the atmosphere instead.

In the international patent reference WO-2016/038093 A1, the TTQ is prolonged by providing a reservoir containing a cryogen. Here, however, the reservoir is designed to be completely hermetically sealed. When the reservoir is heated, an extremely high pressure builds up in the interior. The reservoir therefore has to be accordingly sturdy, and therefore large, heavy, and expensive.

SUMMARY

The present invention improves a "dry," at least "semi-dry", cryostat arrangement comprising a superconducting magnet coil system while avoiding the aforementioned drawbacks of known generic arrangements. In particular, in the event of potential operational malfunctions, the cryostat arrangement is intended to allow a sufficiently long time to quench, and at the same time is intended to be simple and reliable in construction, to be largely maintenance-free (i.e., no need to refill helium) and inexpensive to produce.

This invention connects a volumetric vessel to the coolant circuit of the cryocooler via a pressure-resistant line that is guided through at least part of the vacuum vessel at least in part. At least one fluidic component, which may comprise a throttle element, a two-position valve, or a regulating valve, is arranged in the pressure-resistant line, enabling the flow rate of a cryogenic fluid through the pressure-resistant line to be influenced in a defined manner. The fluidic component is designed such that it influences the flow rate of the volume flow brought about by a pressure differential between the volumetric vessel and the coolant circuit of the cryocooler such that the cryogenic fluid flows between the volumetric vessel and the coolant circuit of the cryocooler with a time constant of at least 15 minutes.

The cryostat arrangement permits a superconducting magnet coil system to be operated in a "dry" manner, i.e. to keep the superconducting magnet coil system at a cryogenic operating temperature without supplying cryogenic fluids, and to maintain this operating temperature for a significant period of time (prolonging the TTQ) even in the event that active cooling fails.

To prolong the TTQ effectively, the invention takes advantage of the coolant circuit of the cryocooler, which is arranged in part outside the vacuum vessel of the cryostat and is generally readily available in systems of this kind. The volumetric vessel is connected to the coolant circuit of the cryocooler by a pressure-resistant line that is guided through the vacuum vessel at least in part. A fluidic component determines the magnitude of a fluid flow through the pressure-resistant line.

In some examples, the fluidic component is constructed and arranged such that the time constant for filling or emptying the volumetric vessel is at least 1 hour, or even over 3 hours. Therefore, the system may be run autonomously for a length of time long enough to bridge the majority of power outages (e.g., in Europe, North America, or the Far East) without quenching the superconducting magnet.

Other cryostat arrangements include temperature sensors and/or pressure sensors.

In a simple example, the fluidic component comprises a passive throttle element. This fluidic component has the lowest technical risk, and is very reliable and very inexpensive.

In other examples, the fluidic component comprises a two-position valve and an electronic control apparatus for the two-position valve. Output signals from temperature sensors and/or pressure sensors may be used to regulate the two-position valve. In comparison to a passive throttle, the actively controlled two-position valve further prolongs the TTQ since the cryogen is now "sacrificed" at the right time in a controlled manner. Cooling is therefore provided when and only when it is actually needed, and the helium consumption rate is thus reduced leading to a large cost saving.

In further examples, the fluidic component comprises a regulating valve and an electronic control apparatus for the regulating valve. Output signals from temperature sensors and/or pressure sensors may be used to regulate the regulating valve. This leads to an additional increase in efficiency when compared with the two-position valve.

The electronic control apparatus for regulating the two-position valve or the regulating valve may be connected to an uninterruptible power supply. The system for bridging a power outage is only really practical (with the exception of the unregulated passive throttle) if the system also "survives" the power outage. An uninterruptible power supply for the electronic control apparatus enables safe regulation during power outages.

In other examples of the cryostat arrangement according to the invention, at least one device (e.g., a flow sensor) can be provided for measuring the current mass flow rate through the pressure-resistant line leading to the volumetric vessel. The output signals of this device may be used to regulate a valve in the fluidic component. The signals from the flow sensor allow the valve to be adaptively regulated even more effectively, which results in a further increase in efficiency.

In some examples, the pressure-resistant line is constructed and arranged such that it allows the cryogenic fluid flowing out of the volumetric vessel into the coolant circuit of the cryocooler to thermally couple to parts of the cryostat which controls the heat input into the superconducting magnet coil system, such as via the cold head of the cryocooler. The helium flowing out absorbs heat at all temperatures on the way out of the vacuum vessel. If the cryogenic fluid is only coupled at the volumetric vessel, the cryogenic fluid would be very cold when it leaves the vacuum vessel and its thermal absorption capacity may be poorly utilized. The cryogenic fluid coming from the volumetric vessel is intended to absorb the heat flowing in from room temperature as adiabatically as possible, e.g., with a counter flow heat exchanger, in order to achieve particularly high efficiency.

These examples may be further improved if the pressure-resistant line comprises a coiled tube arranged at least around parts of the cold finger of the cryocooler. The cold finger is a significant gateway through which heat flows to the magnet system from the room-temperature surroundings. Thermalizing this arm "in the counter flow" enables the practical implementation of the present invention. The coiled tube makes this possible in a simple and yet efficient manner.

Other advantageous variants are characterized in that the superconducting coil system to be cooled is surrounded by a radiation shield within the vacuum vessel. The pressure-resistant line may comprise at least one heat exchanger, which is in thermal contact with the radiation shield and/or with a stage of the cold finger. The radiation shield is also an important part of the system to be cooled because, in addition to the radiation heat, a current lead is also very often in thermal contact with this radiation shield. The current lead provides another gateway for heat to reach the superconducting magnet system.

In some examples, a bypass throttle is also fluidically connected in parallel with the compressor. This bypass throttle allows helium gas flowing out of the vacuum vessel via the pressure-resistant line to move from the high-pressure side to the low-pressure side of the coolant circuit. A buffer volume may be provided on the low-pressure side of the coolant circuit, as described hereinafter. Without the bypass throttle, the high-pressure side would rapidly fill with gas, and a counter pressure would build up, preventing the helium gas from flowing out of the volumetric vessel.

In further examples, the volumetric vessel holds between 0.5 and 5 liters, preferably approximately 1 to 2 liters. These dimensions are convenient and easy to implement, but also enable the TTQ to be prolonged according to the present invention.

In other examples, a buffer volume, for example, with a size of approximately 100 liters, is arranged in the coolant circuit of the cryocooler. The buffer volume may be arranged in a suction line between the cold head and the compressor. The densities of helium at room temperature and at 4 K as well as at high pressures (supercritical) in each case indicate a density ratio of approximately 100. Therefore, an approximately 100 liter buffer volume vessel equates to a 1 liter volumetric vessel.

Examples of the superconducting magnet arrangement may contain high temperature superconductor (HTS) elements. Using HTS material enables the magnet to be operated either at especially high fields or at relatively high temperatures, which simplifies the cooling system.

Some examples of may include the cryostat arrangement as part of a piece of magnetic resonance equipment. Together with the superconducting magnet coil, the cryostat arrangement according to the invention can be part of a magnet system which generates a field strength of between 2 and 20 Tesla, in particular as part of a piece of NMR, MRI or Fourier Transform Mass Spectrometry (FTMS) equipment.

The scope of the present invention also covers a method for operating a cryostat arrangement in which at least one device is provided for measuring the current operating state of the compressor, the current temperature of the superconducting magnet coil system, and/or the current pressure in the pressure-resistant line leading to the volumetric vessel. The fluidic component may be connected to an electronic control apparatus. In the event of an operational malfunction of the compressor of the coolant circuit, e.g., caused by a power outage, and/or in the event of the temperature of the superconducting magnet coil system increasing above a predetermined maximum temperature, and/or in the event of the pressure in the pressure-resistant line leading to the volumetric vessel increasing above a set maximum pressure, the electronic control apparatus actuates the fluidic component such that cryogenic fluid flows out of the volumetric vessel into the coolant circuit of the cryocooler. In one example, this is implemented by single-point regulation, in which a valve is opened or closed depending on the value of a measured regulating parameter in comparison to a predetermined limit. Other regulating algorithms are also conceivable and useful, however. For example, two-point regulation and pulse-width regulation may be used for the two-position valve, and proportional regulation or PID regulation may be used for the regulating valve.

Further advantages of the invention can be found in the description and the drawings. Likewise, the features mentioned above and below may be used either individually or collectively in any desired combinations. The embodiments shown and described are not to be understood as an exhaustive list, but instead are of an exemplary nature for describing the invention.

BRIEF DESCRIPTION OF THE DRAWINGS

The invention is illustrated in the drawings and is explained in greater detail with reference to the embodiments. In the drawings.

DETAILED DESCRIPTION

An actively cooled superconductor magnet system typically includes a superconductor magnet (or magnet coil) in an insulation vacuum cooled by the second stage of a cryocooler. The first stage of the two-stage cryocooler is typically used to cool a radiation shield. The cold head of the cryocooler is connected to a compressor, which compresses a cryogenic fluid (e.g., helium) from approx. 5-10 bar to 20-25 bar during operation. The cryogenic fluid then drives the cold head.

Figure 1:
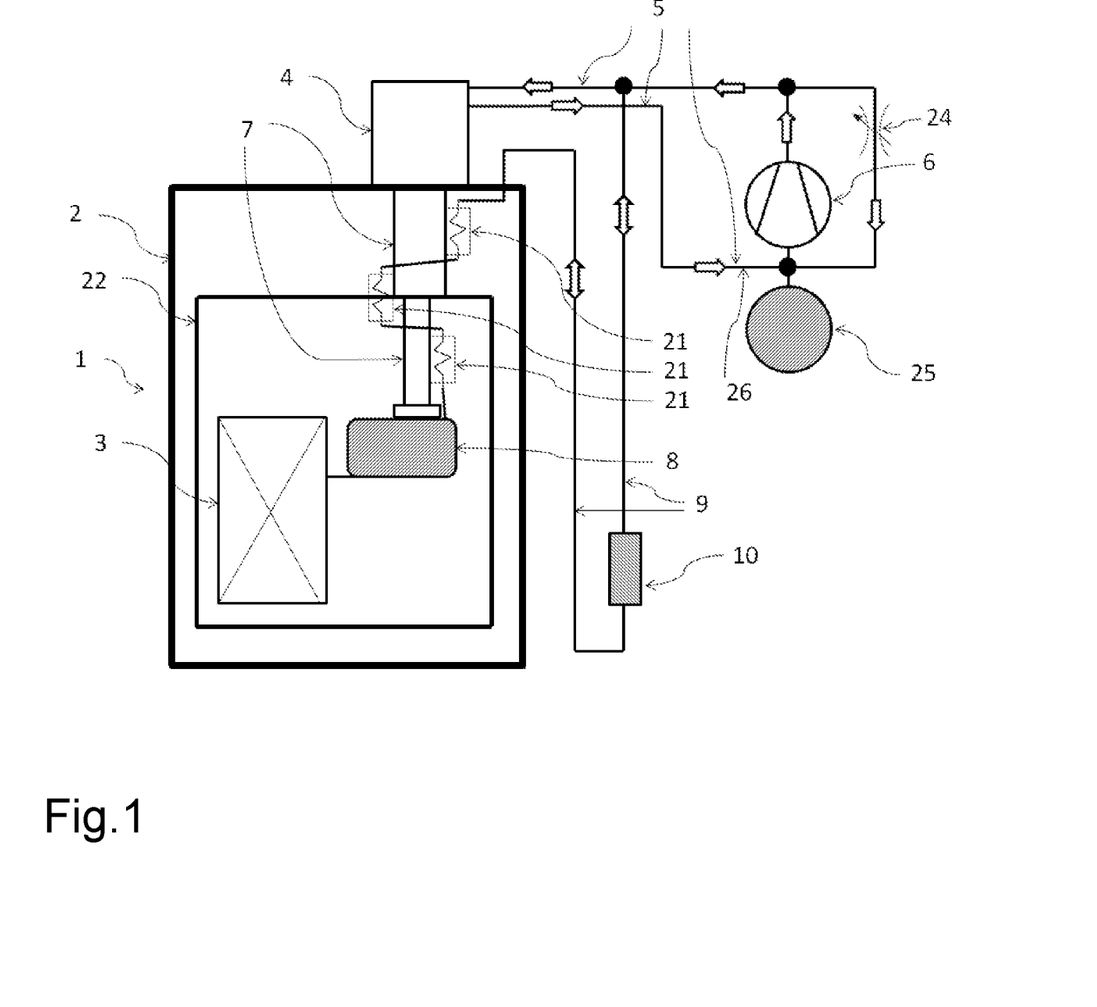
FIG. 1 is a schematic functional diagram of a first example embodiment of the cryostat arrangement according to the invention, in which a TCF (true cryogen free) cryostat includes a cold finger of the cold head surrounded by heat exchangers of the pressure-resistant line.

As shown in FIG. 1, in a cryostat arrangement 1, a superconducting magnet coil system 3 is arranged in a vacuum vessel 2. A cryocooler actively cools the cryostat arrangement 1 with a coolant circuit 5. The coolant circuit 5 comprises a compressor 6 and a cold head 4, which has a cold finger 7. The cold finger 7 is at least a single-stage element, and is a dual-stage element as shown in FIG. 1. The cold finger 7 is in thermal contact with the superconducting magnet coil system 3. A volumetric vessel 8 containing cryogenic fluid, such as helium, is arranged such that the volumetric vessel 8 is thermally conductively connected to the superconducting magnet coil system 3 and/or to parts of the cryostat arrangement 1 via which ambient heat can flow to the superconducting magnet coil system 3.

The volumetric vessel 8 is connected to the coolant circuit 5 of the cryocooler by a pressure-resistant line 9 that is guided through at least part of the vacuum vessel 2. In one example, the volumetric vessel 8 holds between 0.5 and 5 liters, preferably approximately 1 to 2 liters. At least one fluidic component 10, which may comprise a throttle element 12 (see FIG. 2), a two-position valve 13 (see FIG. 3), or a regulating valve 14 (see FIG. 4), is arranged in the pressure-resistant line 9. The fluidic component 10 influences the flow rate of cryogenic fluid through the pressure-resistant line 9 in a defined manner. The fluidic component 10 is designed such that it influences the flow rate of the volume flow brought about by a pressure differential between the volumetric vessel 8 and the coolant circuit 5 of the cryocooler such that the cryogenic fluid flows between the volumetric vessel 8 and the coolant circuit 5 of the cryocooler with a time constant of at least 15 minutes.

In some examples, the fluidic component 10 is constructed and arranged such that the time constant for filling or emptying the volumetric vessel 8 is at least 1 hour, and preferably over 3 hours.

The pressure-resistant line 9 is in turn constructed and arranged such that it allows the cryogenic fluid flowing out of the volumetric vessel 8 into the coolant circuit 5 of the cryocooler to thermally couple to parts of the cryostat which controls the heat input into the superconducting magnet coil system 3, such as via the cold head 4 of the cryocooler.

A bypass throttle 24 may be fluidically connected in parallel with the compressor 6. The bypass throttle 24 has high enough an impedance not to "short-circuit" the compressor 6 but has low enough an impedance to allow the helium to flow back into the buffer volume 25 in the event of the compressor 6 malfunctioning.

Alternatively, the bypass throttle 24 may be replaced by a switchable valve. This switchable valve may, e.g., be "NO" (normally open), and may be connected to the power supply such that it is in parallel with the compressor 6. In the event of a power outage, the switchable valve opens, and the helium can flow back into the buffer volume 25. Alternatively, the switchable valve may also be connected to a control output of the compressor 6 or to a control output of the electronic regulating unit 15, further optimizing the regulation of the helium. Using the switchable valve instead of the bypass throttle 24 also serves to increase efficiency, since the "leakage flow" occurring at the bypass throttle 24 is prevented in the operating state, i.e., when the switchable valve is closed.

In addition, a buffer volume 25, for example, with a size of approximately 100 liters, can be arranged in the coolant circuit 5 of the cryocooler. In particular the buffer volume 25 may be arranged in a suction line 26 between the cold head 4 and the compressor 6.

The superconducting magnet coil system 3 is surrounded by a radiation shield 22 within the vacuum vessel 2. As shown in FIGS. 1-4, which show TCF variants of the cryostat arrangement 1, the pressure-resistant line 9 may comprise one or more heat exchangers 21, which is/are in thermal contact with the radiation shield 22 and/or with a stage of the cold finger 7.

Figure 5:
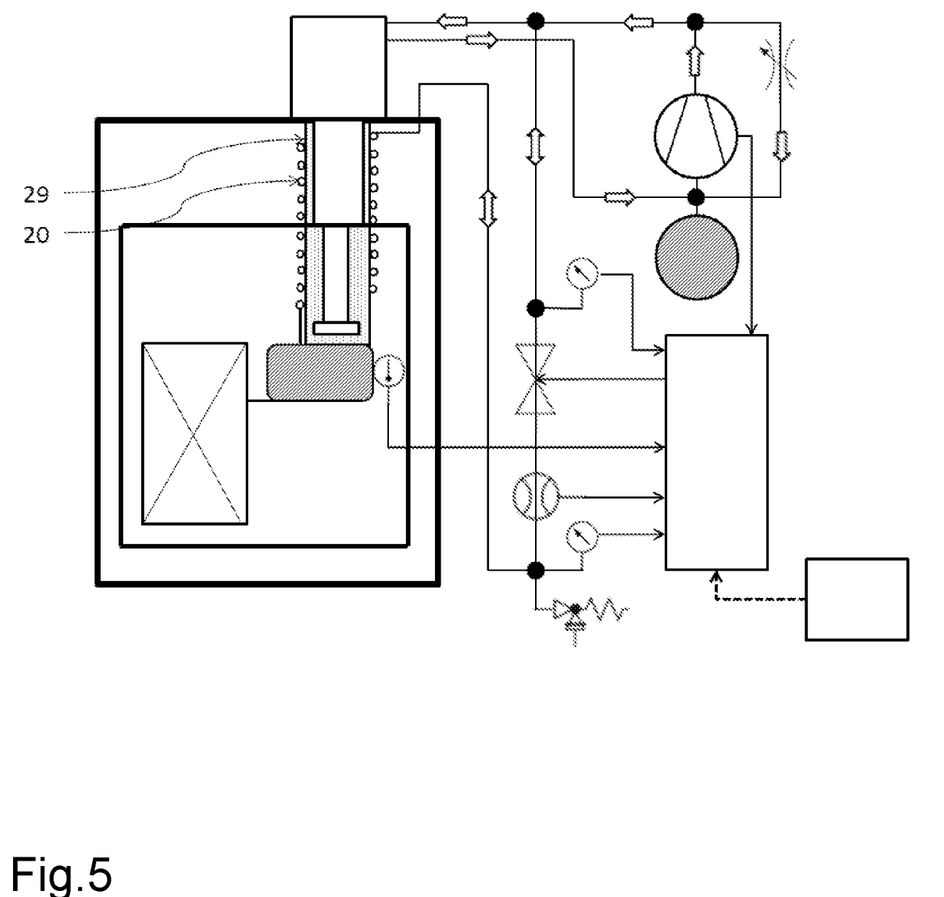
FIG. 5 extends the example embodiment of FIG. 4 with a GCT (gas coupled technology) variant of the cryostat arrangement, in which a reception tube of the cryocooler in the vacuum vessel is surrounded by a coiled tube.

FIG. 5 shows a GCT variant of the cryostat arrangement 1 in which the pressure-resistant line 9 comprises a coiled tube 20 arranged at least around parts of the cold finger 7. In the example shown, the coiled tube 20 is arranged around a reception tube 29 of the cryocooler.

Figure 3:
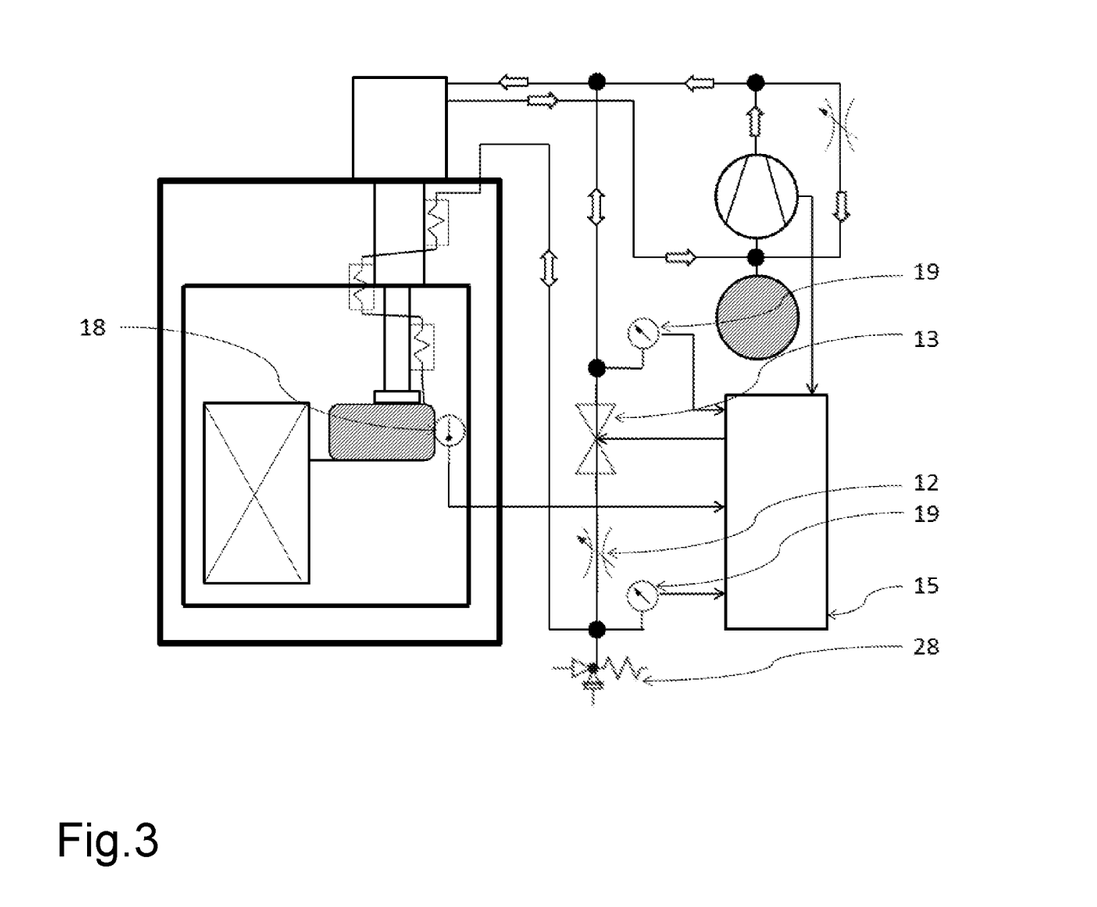
FIG. 3 extends the example embodiment of FIG. 2 with temperature sensors, pressure sensors, a two-position valve as an additional fluidic component, and an electronic control apparatus for actuating the valves.
Figure 4:
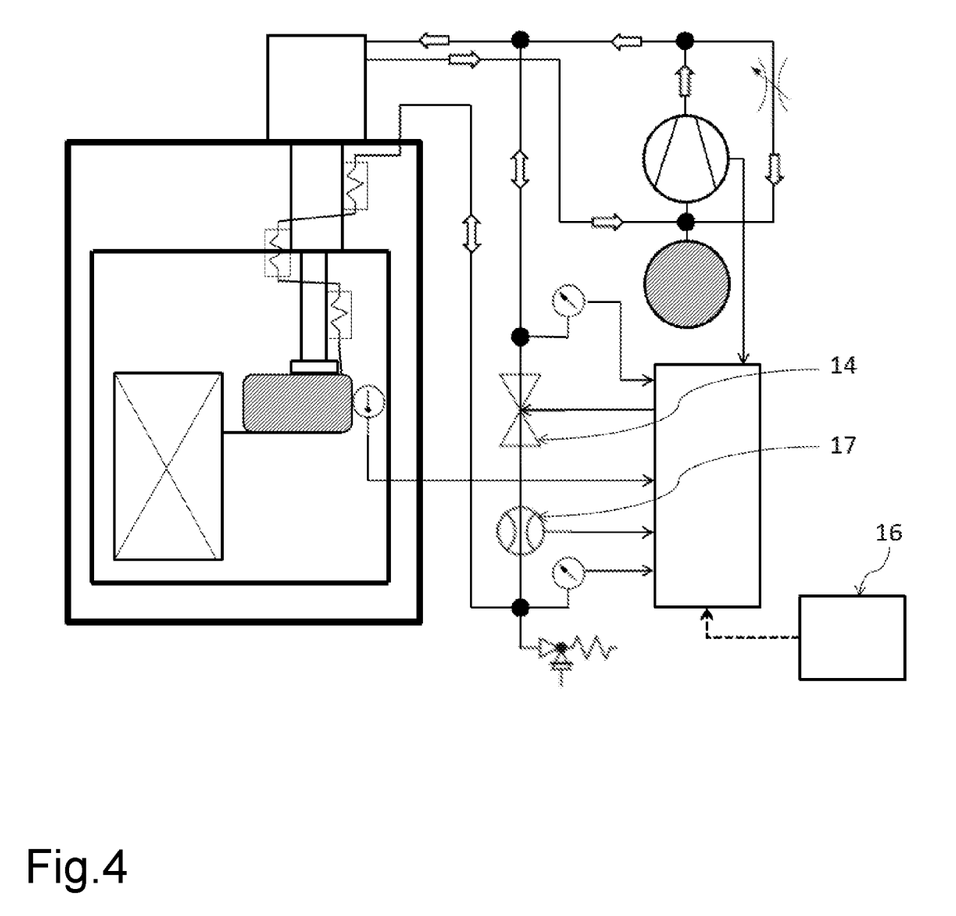
FIG. 4 extends the example embodiment of FIG. 3 with a fluidic component designed as a regulating valve, a flow sensor, and an uninterruptible power supply of the electronic control apparatus.

As shown in FIGS. 3-5, the cryostat arrangement 1 may comprise temperature sensors 18 and/or pressure sensors 19. The output signals of the sensors 18/19 are fed into an electronic control apparatus 15 in order to actuate valves that control the flow rate of the cryogenic fluid in the pressure-resistant line 9, such as two-position valve 13 or regulating valve 14. The control apparatus 15 may be connected to an uninterruptible power supply 16, as shown in FIG. 4 and FIG. 5. It is also possible to use a flow sensor 17. In order to prevent excessive pressure from building up, a safety valve 28 may also be installed in the pressure-resistant line 9.

Figure 2:
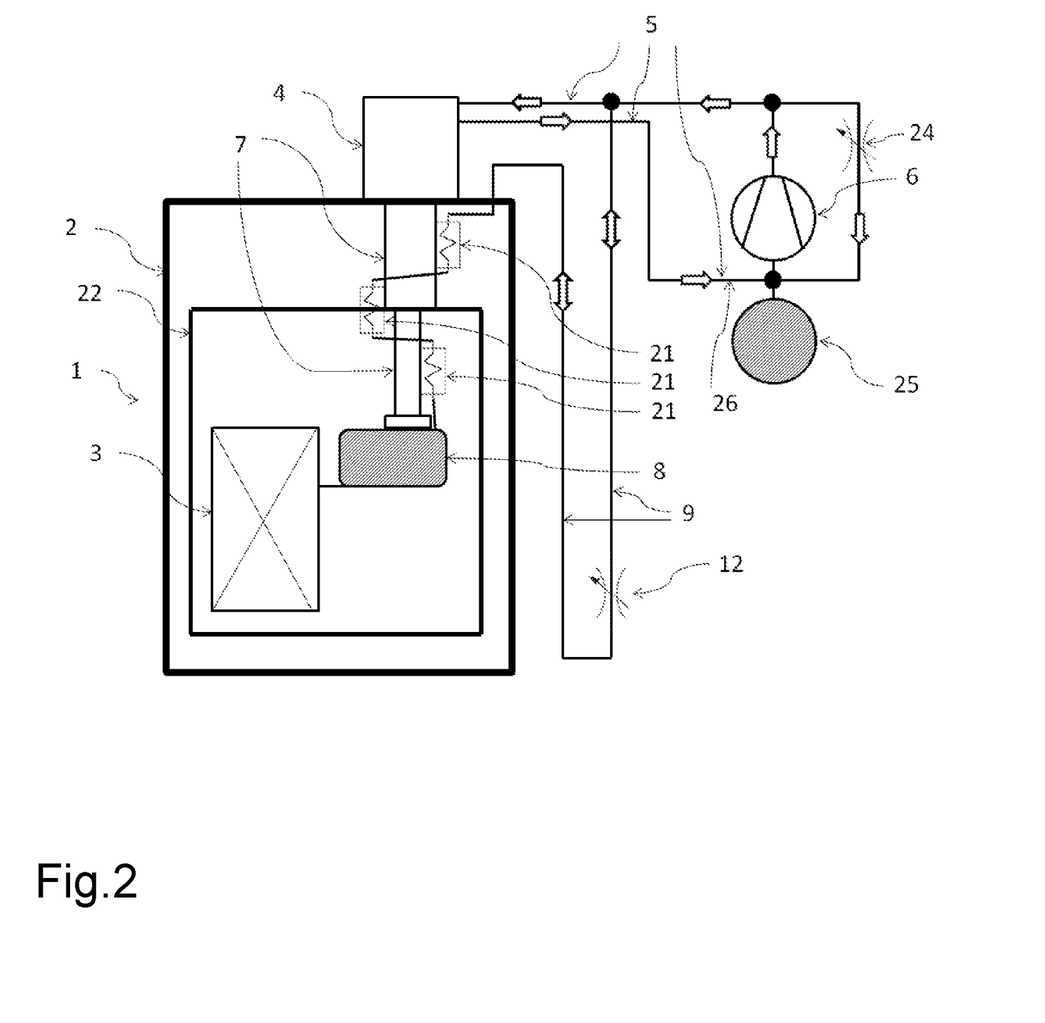
FIG. 2 extends the example embodiment of FIG. 1 with a fluidic component specifically designed as a throttle element.

In the example shown in FIG. 2, the pressure-resistant line 9 is connected to the high-pressure side of the cold head helium compressor 6 by means of the throttle element 12. The throttle 12 is designed such that the helium flows at a well-defined speed, e.g. for a few hours, when the valve is open, both when filling and when emptying the volumetric vessel 8. This prevents hot gas from flowing towards the magnet too rapidly during filling, which risks quenching the superconducting magnet 3. The throttle 12 defines the time scale of the TTQ prolongation or the cooling capacity during emptying. In addition, a buffer volume 25 (e.g., with a size of approximately 100 liters) is provided in the suction line 26 of the compressor 6.

In the following, the individual operating states of the arrangement set out above are described:

1. Not in use (e.g., when the system is delivered): All the volumes are at room temperature and at a static (average) pressure of approx. 15 bar, including the buffer volume 25 and the low-temperature pressure reservoir (volumetric vessel 8).

2. Cooling: The compressor 6 starts up and lowers the pressure on the low-pressure side (e.g., to 5 bar), and raises the pressure on the high-pressure side (e.g., to 25 bar). While the cooler is cooling the magnet, some of the helium gas from the high-pressure side is successively cooled and passed into the volumetric vessel 8 through the throttle 12 until it ultimately reaches, at the end of the cooling process, a temporal equilibrium at a density of approximately 160 g/l at approximately 25 bar at 4.2 K in the supercritical state. In this state, the helium gas has been continuously outputting heat to the cold head 4 over the entire temperature range of from 300 K to as low as 4 K, and the specific heat is always in the range of Cp=512R, i.e. approx. 20 J/mol K. With a rise in temperature of 300 K, approx. 40 mol per liter (1 mol=4 g) and a 1-liter volumetric vessel 8, a thermal absorption capacity of over 200 kJ is thus produced. The buffer volume 25 provides the helium gas that is condensed into the volumetric vessel 8.

3. Normal operation: Pressure fluctuations on the high-pressure side of the coolant circuit 5 (e.g., due to the working cycle of the cold head 4) propagate to the volumetric vessel 8 and lead to an additional heat load. However, the throttle 12 sufficiently mitigates the pressure fluctuations in the volumetric vessel 8.

4. Power outage: The compressor 6 stops, the cold head 4 no longer cools, heat flows into the system along various paths (e.g. through brackets, the current lead, the cold head itself). The cryogen (e.g., helium) in the volumetric vessel 8 flows out through the coils 21 and the throttle 12 and absorbs heat in the process, i.e. the time to quench is prolonged. In the coils 21 on the way out of the volumetric vessel 8, the helium absorbs yet more heat that is flowing in, such that it ideally leaves the vacuum vessel 2 at approximately room temperature. The static pressure of approximately 15 bar incidentally prevails behind the throttle during the power outage. This may be ensured either by a bypass throttle 24 arranged in parallel with the compressor or by an electrically controlled valve in the same position.

5. Recovery: Power returns, the compressor 6 starts up again, the cold head 4 cools again. A gas pressure differential builds up again over the compressor 6, and as a result the pressure over the throttle 12 slowly fills the volumetric vessel 8 with helium again.

In another example, an electrically actuated valve (e.g., two-position valve 13 or regulating valve 14), may be used for active control. The electrically actuated valve may be connected to the throttle 12 in series in order to achieve a smoother response. The electrically actuated valve itself may be actuated by the electronic control apparatus 15, which determines the switching state (open/closed) from a stored logic and from connected sensors and logic inputs. The electronic control apparatus 15 may be assisted by an uninterruptible power supply (UPS) or similar, since controlling the cryogenic fluid flow is particularly important in the event of a power outage.

In normal operation, the electrically actuated valve is closed once the system is cold. This prevents helium gas from being constantly forced into the volumetric vessel 8 and withdrawn from the volumetric vessel 8 by pressure fluctuations on the high-pressure side, which prevents an additional heat load, as described hereinabove. When the electrically actuated valve is closed, the cooler system (e.g., cold head 4 and compressor 6) operates completely separately from the enclosed helium in the volumetric vessel 8.

In the event of a power outage, the electronic control apparatus 15 detects the malfunction of the compressor 6 and opens the electrically actuated valve so that helium can flow out of the volumetric vessel 8, typically at approximately 3-5 Kelvin. The electronic control apparatus 15 measures the temperature T1 and opens the electrically actuated valve in a metered manner if required, such that only as much cooling capacity is generated as is actually required. This prolongs the autonomy time in which the superconducting magnet system 3 is maintained below its critical temperature. Metering the operation of the electrically actuated valve may also compensate for the effect whereby the outflow speed depends on the remaining amount of gas in the reservoir, i.e. the cold helium gas flows out more rapidly at the start than at the end. In practice, the required cooling capacity instead behaves in the opposite manner over time. In one example, pulse-width modulating the e two-position valve 13 may be used to compensate for this difference in cooling availability and cooling requirement.

During recovery (i.e., when the power returns, the compressor 6 starts up again, and the cold head 4 cools again), the electrically actuated valve may be used to select the condensation speed in the volumetric vessel 8.

In the example shown in FIG. 4, the two-position valve 13 in FIG. 3 is replaced by a regulating valve 14. The throttle element 12 can then be omitted.

In other examples, the mass flow of the gas flowing through the pressure-resistant line 9 to the volumetric vessel 8 may be measured and used to regulate the electrically actuated valve, in addition to the pressure and temperature.

One main field of application of the cryostat arrangement according to the invention is use in magnetic resonance equipment. In this case, together with the superconducting magnet coil 3, the cryostat arrangement 1 is part of a magnet system which can generate a field strength of between 2 and 20 Tesla, in particular as part of a piece of NMR, MRI or FTMS equipment. However, other applications that are required to maintain cryogenic temperatures through power outages may also benefit from the techniques described herein.

LIST OF REFERENCE SIGNS

1 cryostat arrangement
2 vacuum vessel
3 superconducting magnet system
4 cold head
5 coolant circuit
6 compressor
7 cold finger
8 volumetric vessel
9 pressure-resistant line
10 fluidic component
12 throttle element
13 two-position valve
14 regulating valve
15 electronic control apparatus
16 uninterruptible power supply
17 flow sensor
18 temperature sensor
19 pressure sensor
20 coiled tube
21 heat exchanger
22 radiation shield
24 bypass throttle
25 buffer volume
26 suction line
28 safety valve
29 reception tube of the cryocooler

What is claimed is:

1. A cryostat comprising:
a vacuum vessel in which a superconducting magnet coil system is arranged;
a cryocooler that actively cools the cryostat with a coolant circuit comprising a compressor, a cold head, and a cold finger in thermal contact with the superconducting magnet coil system; and
a volumetric vessel that is thermally coupled to the superconducting magnet coil system or to one or more portions of the cryostat that conduct ambient heat to the superconducting magnet coil system,
wherein the volumetric vessel is connected to the coolant circuit of the cryocooler via a pressure-resistant line that is guided through at least part of the vacuum vessel, wherein the pressure-resistant line includes at least one fluidic component that is configured to influence a flow rate of a cryogenic fluid through the pressure-resistant line in response to a pressure differential in the pressure-resistant line between the volumetric vessel and the coolant circuit, and wherein the fluidic component is configured to influence the flow rate of the cryogenic fluid such that the cryogenic fluid flows from the volumetric vessel and through the coolant circuit in no less than 15 minutes.

2. The cryostat according to claim 1, wherein the fluidic component is configured to reduce the flow rate of the cryogenic fluid such that the cryogenic fluid flows from the volumetric vessel and through the coolant circuit in no less than 1 hour.

3. The cryostat according to claim 1, wherein the fluidic component is configured to reduce the flow rate of the cryogenic fluid such that the cryogenic fluid flows from the volumetric vessel and through the coolant circuit in no less than 3 hours.

4. The cryostat according to claim 1, further comprising temperature sensors or pressure sensors.

5. The cryostat according to claim 1, wherein the fluidic component comprises a passive throttle element.

6. The cryostat according to claim 4, wherein the fluidic component comprises a two-position valve and an electronic control apparatus for the two-position valve, and wherein output signals from the pressure sensors are used to regulate the two-position valve.

7. The cryostat according to claim 4, wherein the fluidic component comprises a regulating valve and an electronic control apparatus for the regulating valve, and wherein output signals from the pressure sensors are used for regulating the regulating valve.

8. The cryostat according to claim 6, further comprising an uninterruptible power supply connected to the electronic control apparatus.

9. The cryostat according to claim 7, further comprising an uninterruptible power supply connected to the electronic control apparatus.

10. The cryostat according to claim 1, wherein the pressure-resistant line is configured to allow the cryogenic fluid flowing out of the volumetric vessel into the coolant circuit to exchange heat with the one or more portions of the cryostat that conduct ambient heat to the superconducting magnet coil system.

11. The cryostat according to claim 10, wherein the one or more portions of the cryostat that conduct ambient heat to the superconducting magnet coil system include the cold head of the cryocooler.

12. The cryostat according to claim 10, wherein the pressure-resistant line comprises a coiled tube arranged around at least parts of the cold finger.

13. The cryostat according to claim 10, further comprising a radiation shield surrounding the superconducting magnet coil system, wherein the pressure-resistant line comprises at least one heat exchanger in thermal contact with the radiation shield or with a stage of the cold finger.

14. The cryostat according to claim 1, further comprising a bypass throttle fluidically connected in parallel with the compressor.

15. The cryostat according to claim 1, wherein the volumetric vessel holds between 0.5 liters and 5 liters.

16. The cryostat according to claim 1, further comprising a buffer volume arranged in a suction line between the cold head and the compressor.

17. The cryostat according to claim 1, wherein the superconducting magnet coil generates a magnetic field with strength of between 2 and 20 Tesla.

18. The cryostat according to claim 17, wherein the cryostat is in a Nuclear
   Magnetic Resonance (NMR), Magnetic Resonance Imaging (MM), or Fourier Transform Mass Spectrometry (FTMS) apparatus.

19. A cryostat comprising:
   a vacuum vessel in which a superconducting magnet coil system is arranged;
   a cryocooler that actively cools the cryostat with a cryogenic fluid in a coolant circuit comprising a compressor, a cold head, and a cold finger in thermal contact with the superconducting magnet coil system;
   a buffer volume connected to the coolant circuit; and
   a volumetric vessel that is connected to the coolant circuit and that is thermally coupled to the superconducting magnet coil system or to one or more portions of the cryostat that conduct ambient heat to the superconducting magnet coil system,
   wherein the volumetric vessel and the buffer volume are connected to the coolant circuit via a pressure-resistant line through which the cryogenic fluid flows and which extends through at least part of the vacuum vessel in the coolant circuit, and
   wherein the pressure-resistant line includes at least one impedance that reduces a flow rate of the cryogenic fluid through the pressure-resistant line in response to a pressure differential in the pressure-resistant line between the volumetric vessel and the coolant circuit, such that the cryogenic fluid flows from the volumetric vessel to the buffer volume via the coolant circuit in no less than 15 minutes.

* * * * *